US005619461A

United States Patent [19]
Roohparvar

[11] Patent Number: 5,619,461
[45] Date of Patent: Apr. 8, 1997

[54] MEMORY SYSTEM HAVING INTERNAL STATE MONITORING CIRCUIT

[75] Inventor: Frankie F. Roohparvar, Cupertino, Calif.

[73] Assignee: Micron Quantum Devices, Inc., Santa Clara, Calif.

[21] Appl. No.: 508,924

[22] Filed: Jul. 28, 1995

[51] Int. Cl.$^6$ .............................. G06F 11/00; G11C 7/00
[52] U.S. Cl. ......................... 365/201; 371/21.1; 371/21.2
[58] Field of Search ..................................... 365/200, 201; 371/51.1, 21.1, 21.2, 10.1

[56] References Cited

U.S. PATENT DOCUMENTS

| | | | |
|---|---|---|---|
| 5,177,745 | 1/1993 | Rozman | 365/201 |
| 5,212,442 | 5/1993 | O'Toole et al. | 324/158 R |
| 5,233,610 | 8/1993 | Nakayama et al. | 371/51.1 |
| 5,463,585 | 10/1995 | Sanada | 365/201 |

Primary Examiner—Viet Q. Nguyen
Attorney, Agent, or Firm—Limbach & Limbach L.L.P.

[57] ABSTRACT

A memory system having a test mode which can be used to access signals internally generated by the system during its operation. The signals accessible in the test mode are not available to a standard user of the system, but can be used by a memory chip designer to determine the cause of a device failure. The memory system includes a test signal switch which is used to route one of a multitude of internal signals to an input/output (I/O) pad where the information can be accessed by a chip designer. In order to access the internal signals, the memory system is first placed into a test mode, which acts to shut off the data paths used for reading the output of the sense amplifier included as part of the data read path or for reading the contents of the status register. A signal specifying a particular test signal of interest is then input. Decode logic is used to verify the coded input signal and control the multiplexer to route a specified internal signal through the switch to the I/O pad. By operating the memory system and monitoring the selected signal or data, a chip designer can isolate the cause of a device failure and investigate solutions to the problem without the need for micro-probing of the device.

38 Claims, 4 Drawing Sheets

MEMORY SYSTEM HAVING INTERNAL STATE MONITORING CIRCUIT

TECHNICAL FIELD

The present invention relates to memory systems, and more specifically, to a memory system having a test signal mode of operation which allows access to signals generated by a memory device during its operation. This permits a memory chip designer to investigate failures of the memory device by determining at what stage in the operation of the device an error occurred.

BACKGROUND OF THE INVENTION

Figure 1:
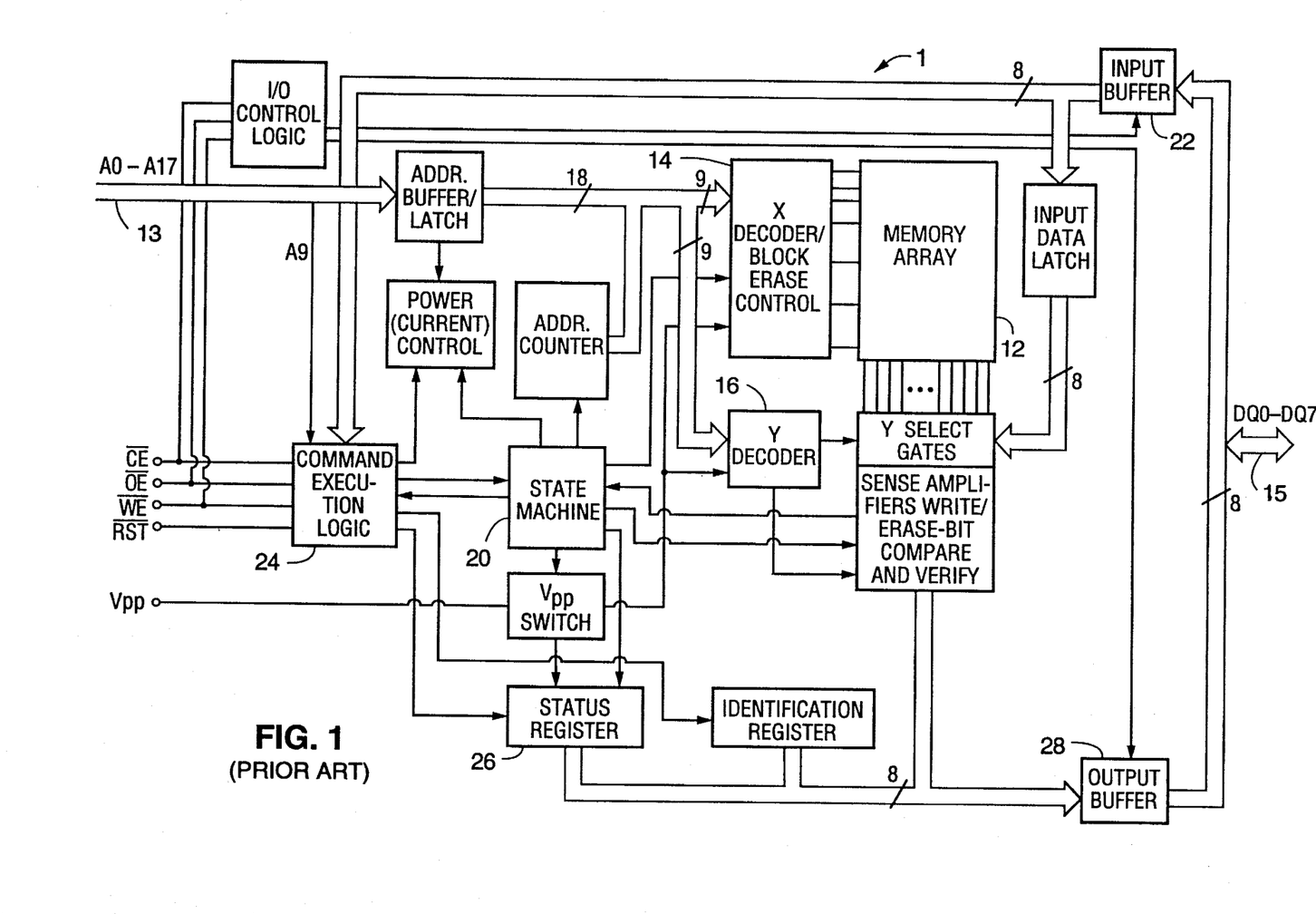
FIG. 1 is a functional block diagram of a conventional flash memory system.

FIG. 1 is a functional block diagram of a conventional flash memory system 1. The core of memory system 1 is an array 12 of flash memory cells. The individual cells in array 12 are arranged in rows and columns, with there being, for example, a total of 256K eight bit words in array 12. The individual memory cells (not shown) are accessed by using an eighteen bit address A0–A17, which is input by means of address pins 13. Nine of the eighteen address bits are used by X decoder 14 to select the row of array 12 in which a desired memory cell is located, and the remaining nine bits are used by Y decoder 16 to select the appropriate column of array 12 in which the desired cell is located.

Memory system 1 contains an internal state machine (ISM) 20 which controls the data processing operations performed on memory array 12, such as the steps necessary for carrying out programming, reading and erasing operations for the memory cells of array 12. State machine 20 functions to reduce the overhead required of an external processor (not depicted) typically used in association with memory system 1.

For example, if memory cell array 12 is to be erased (typically, all or large blocks of cells are erased at the same time), the external processor causes the output enable pin $\overline{OE}$ to be inactive (high), and the chip enable $\overline{CE}$ and write enable $\overline{WE}$ pins to be active (low). The processor then issues an 8 bit command 20H (0010 0000) on data I/O pins 15 (DQ0–DQ7), typically called an Erase Setup command. This is followed by the issuance of a second eight bit command D0H (1101 0000), typically called an Erase Confirm command. Two separate commands are used to initiate the erase operation so as to minimize the possibility of inadvertently beginning an erase procedure.

The commands issued on I/O pins 15 are transferred to data input buffer 22 and then to command execution logic unit 24. Command execution logic unit 24 receives and interprets the commands used to instruct state machine 20 to perform the steps required for erasing array 12 or carrying out another desired operation. Once the erase sequence is completed, state machine 20 updates 8 bit status register 26. The contents of status register 26 is transferred to data output buffer 28, which makes the contents available on data I/O pins 15 of memory system 1. Status register 26 permits the external processor to monitor the status of state machine 20 during memory array write and erase operations. The external processor periodically polls data I/O pins 15 to read the contents of status register 26 in order to determine whether an erase sequence (or other operation) has been completed and whether the operation was successful.

As noted, the contents of status register 26 provides information to a user of memory system 1 concerning the internal operation of the memory system. This information includes the status (ready or busy) of state machine 20, whether an erase or write operation has been successful, whether an erase operation has been suspended, and whether the write/erase supply voltage (Vpp) is present.

Figure 2:
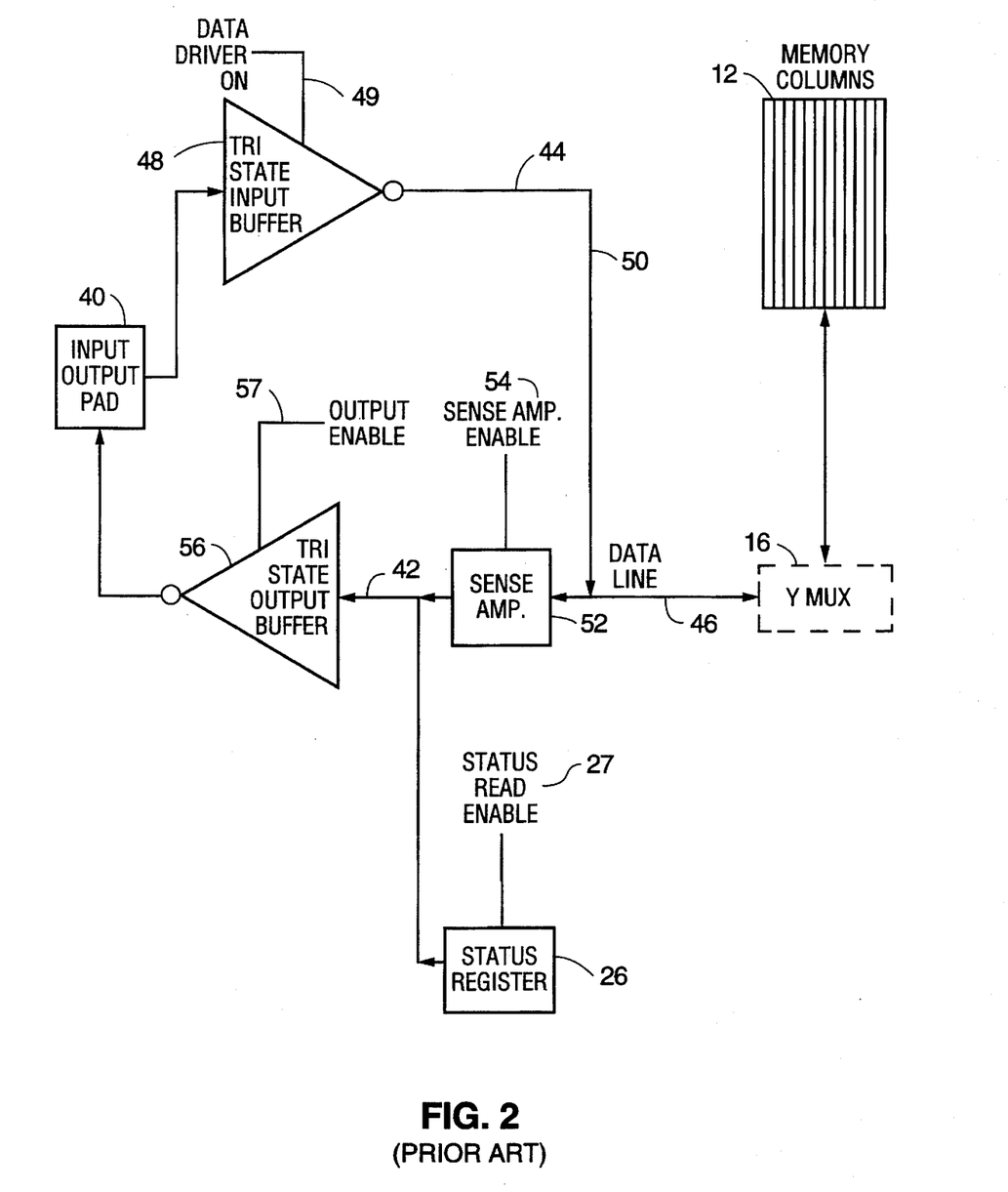
FIG. 2 is a block diagram of the components of the memory system of FIG. 1 which are used in writing data to and reading data from a memory cell contained in an array of memory cells, and in reading the contents of a status register.

FIG. 2 is a block diagram of the components of memory system 1 of FIG. 1 which are used in writing data to and reading data from a memory cell contained in array 12, and in reading the contents of status register 26. As shown in FIG. 2, an input/output (data) pad 40 is connected to circuit elements which form a data read path 42 and a data write path 44 to memory array 12. Pad 40 is part of the metallization of the integrated circuit containing the memory array and is connected by a wire bond or other means to a data pin of the integrated circuit package.

Read path 42 and write path 44 are electrically connected to data line 46, which connects those paths to memory array 12 by means of decoder or multiplexer 16. Note that in FIG. 2, only Y decoder 16 is shown. Similarly, only the columns of array 12 are indicated. However, as shown in FIG. 1, X decoder 14 which connects to the rows of array 12 is also part of memory system 1. Thus, both X decoder 14 and the rows of array 12 could typically be shown in a more complete diagram of the components.

Write path 44 typically includes a data latch (not shown) for storing data input by means of pad 40. The data latch is activated or enabled by a latch enable signal. The latched data is sent to data input buffer 48, which produces the voltage on line 50 which is applied to a memory cell in order to program the cell. Input buffer 48 is typically implemented in the form of a tri-statable driver having an output which can be placed in a high impedance mode and effectively disabled during a read (or other non-programming) operation. The disabling of input buffer 48 is achieved by means of tri-state control line 49. In some implementations, the functions of the latch and input buffer 48 may be combined into a single device. A latch element is used so that the input/output pins can be used for other functions after the programming signals are input and while the signals are being processed by elements of the data write circuit.

When reading a memory cell of array 12, decoder (multiplexer) 16 is again used to access the desired memory cell in the array. In the event the cell being read is in an erased state, the cell will conduct a current which is converted to a voltage along line 46. Sense amplifier 52 is used to determine the state of the cell, i.e., whether it is programmed or erased (corresponding to a binary value of 0 or 1, respectively), and is enabled by means of sense amplifier enable signal 54. The state of a memory cell is determined by comparing the voltage on data line 46 to a reference voltage. The outcome of this comparison between the two input voltages is an output which is either high or low, corresponding to a digital value of one or zero.

The output of sense amplifier 52 is sent to output buffer 56 which drives the data to output pad 40, where it is accessed by a user. Output buffer 56 is enabled by means of output enable signal 57. It is noted that a typical memory system would contain an input buffer, output buffer, sense amplifier, and data read and data write path of the type shown in FIG. 2 for each input/output pin 15 of FIG. 1.

When the external processor polls status register 26 to determine the status of a read or write operation, sense amplifier enable signal 54 is used to disable sense amplifier 52 by taking that node to a high impedance. Status register enable signal 27, which is typically at a high impedance value during a read operation, is then used to enable a read of status register 26 and to route the contents of status register 26 to pad 40. As previously mentioned pad 40 is connected to an input/output pin 15 of FIG. 1.

However, the information provided by status register 26 is indicative of only a small subset of the signals generated during the operation of memory system 1. Other internal signals and data indicative of the operating status or state of the memory system are generated during different stages of the read, erase, and programming operations. This information can be used by a memory chip designer to determine at which stage of operation an error occurred, thereby causing a malfunction of the memory device.

Although these internal signals and data are of use in determining the cause of a device failure, this information cannot be readily accessed in most memory systems. One means for accessing the signals is to open up the memory package and use a probe to read the signals generated at various points in the device as the device cycles through its operations. This process is referred to as micro-probing of the device. However, micro-probing is of limited use in investigating a failed memory device inside a package because memory system dies inside a package generally have a layer of passivation glass deposited on them. This prevents successful micro-probing of the device even if the package is opened.

What is desired is a memory system in which the cause of a device failure or operational error can be determined with greater accuracy than is possible with presently available systems. This and other advantages of the present invention will be apparent to those skilled in the art upon a reading of the following Detailed Description of the Invention together with the drawings.

SUMMARY OF THE INVENTION

The present invention is directed to a memory system having a test mode which can be used to access signals which are internally generated by the system during its operation. The signals are not available to a standard user of the system, but can be used by a memory chip designer to determine the cause of a device failure.

The memory system includes a test signal switch or multiplexer which can be used to route one of a multitude of internal signals indicative of the operating status or state of the system to an input/output (I/O) pad where the information can be accessed by a chip designer. In order to access the internal signals, the memory system is first placed into a test mode, which acts to shut off the data paths used for reading the output of the sense amplifier included as part of the data read path or for reading the contents of a status register.

A signal specifying a particular test signal of interest is then input through an I/O pad. Test signal decode logic is used to verify the coded input signal and control the multiplexer to route the specified signal through the test signal switch to the I/O pad. By operating the memory system and monitoring the selected test signal, a chip designer can isolate the cause of a device failure and investigate solutions to the problem.

Further objects and advantages of the present invention will become apparent from the following detailed description and accompanying drawings.

DETAILED DESCRIPTION OF THE INVENTION

Figure 3:
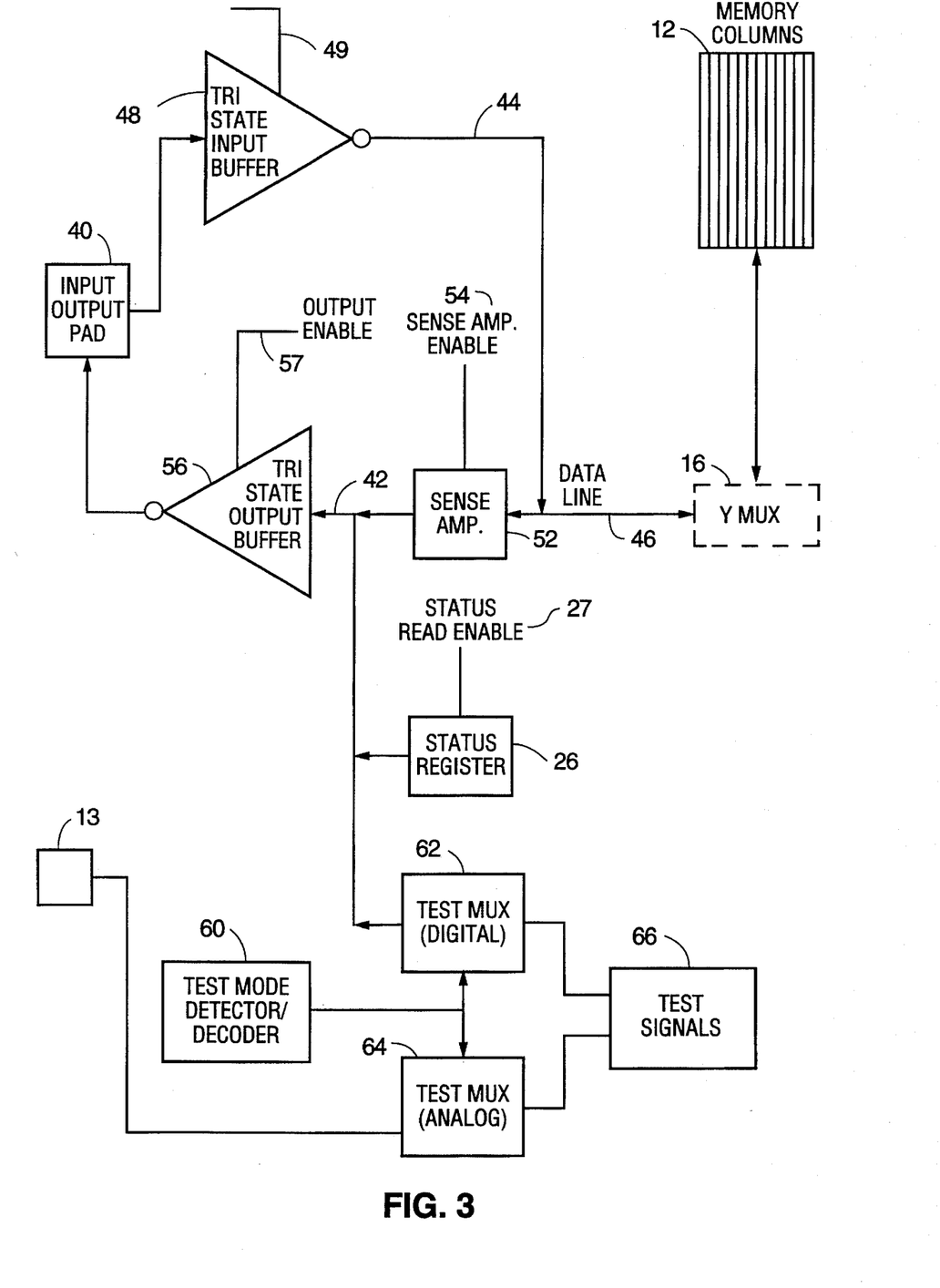
FIG. 3 is a block diagram of the components of a memory system used to implement an embodiment of the present invention.

Referring again to the drawings, FIG. 3 is a block diagram of the components of a memory system used to implement an embodiment of the present invention. Although the present invention will be described with reference to the typical components of a flash memory system, it is not restricted to such and may also be implemented in other forms of memory systems. As with the components of the memory system shown in FIG. 2, an input/output pad 40 is connected to circuit elements which form a data read path 42 and a data write path 44 to memory array 12. Read path 42 and write path 44 are electrically connected to data line 46, which connects those paths to memory array 12 by means of decoder or multiplexer 16. As with FIG. 2, only Y decoder 16 and the columns of array 12 are indicated. In a complete diagram of the components, both X decoder 14 of FIG. 1 and the rows of array 12 could typically be shown. It is noted that certain aspects of the present invention which relate to accessing the internally generated signals by entering a test mode of operation and which will be discussed in greater detail later are described in U.S. Pat. No. 5,526,364, entitled, "Apparatus for Entering and Executing test Mode Operations for Memory", issued Jun. 11, 1996, the disclosure of which is hereby incorporated in full by reference.

When reading a memory cell of array 12, decoder (multiplexer) 16 is used to access a desired memory cell in the array. Sense amplifier 52 is used to determine the state of the cell, and is enabled by means of sense amplifier enable signal 54. The output of sense amplifier 52 is sent to output buffer 56 which drives the data to output pad 40 where it is accessed by a user. Output buffer 56 is enabled by means of output enable signal 57.

As discussed with reference to FIG. 2, when an external processor polls status register 26 to determine the status of a read or write operation, sense amplifier enable signal 54 is used to disable sense amplifier 52 by bringing that node to a high impedance. Status register enable signal 27, which is used to place that node at a high impedance during a read operation, is then used to enable the register and to route the contents of status register 26 to pad 40. As previously mentioned, pad 40 is connected to an input/output pin 15 of FIG. 1.

In accordance with the present invention, the memory system of FIG. 3 includes a test mode detector/decoder 60 which is used to place the memory system into a test mode and to verify that a valid code has been entered to select an internal signal for routing to either pad 40 (in the case of a digital signal) or to an address pin 13 (in the case of an analog signal). Test mode detector 60 controls digital test signal switch (multiplexer) 62 and analog test signal switch (multiplexer) 64 which act to route the selected internally generated signal 66 to pad 40 or address pin 13 (or another desired location) for purposes of monitoring the operation of the memory system and/or determining the cause of a device failure.

The memory system is designed so that a selected group of internal signals indicative of the operating status or state of the memory system are available as test signals 66 which can be accessed by the present invention. These signals 66 typically include those which indicate the state which the internal state machine (and hence memory system) is in, and those used to initiate actions which cause the internal state machine to transition from one state to another. In general terms, the signals 66 provided are used to evaluate the status and operation of the internal circuitry of the memory system, and are of the type which would not be of use to a normal user of the system. The manner in which the desired signals are routed to the multiplexers is layout dependent and is accomplished by methods known in the industry. It is noted that if capacitance loading of the signal paths is an issue in routing the signals to the multiplexers, then this should be taken into consideration in the design of the multiplexers.

As noted, digital and analog test signal switches 62 and 64 typically take the form of a multiplexer which is controlled so as to select one of its multiple inputs for routing to other parts of the circuit where the signals may be accessed by a chip designer. The digital signals which are included in internal signals 66 are routed to digital switch 62, while the analog signals which are included in internal signals 66 are routed to analog switch 64. Digital and analog test signal switches 62 and 64 are enabled by means of a signal provided by test mode detector 60, where the enabling signal is provided in response to the memory system being placed into a test mode.

The memory system is capable of operating in a normal mode of operation and an alternative or test mode of operation. In the normal mode of operation, an end user can carry out normal memory functions including programming, erasing and reading of the memory cells. The alternative or test mode of operation is used for carrying out various memory functions other than the normal functions and is a mode not intended to be accessed by end users. Detector/decoder 60 detects certain test inputs to the memory and switches the memory to a selected test mode.

The memory system can be placed into a test mode by one of several methods. It has been found desirable to utilize a method which reduces the possibility of a standard user of the memory system being able to access the test mode. This has been achieved by a procedure in which a high voltage is simultaneously applied to two or more pins of the memory system circuit that normally have much lower voltages applied during operation of the system. Thus, the applied voltages used to enter the test mode are outside of the range of voltages which would be applied during normal operation of the memory system by a user wishing to program, erase, or read the contents of the memory cells. For example, if the range of voltages applied to a particular pin or pins during normal operation of the memory system is in the range of 5 volts±1 volt, then the voltage applied to initiate the test mode might be chosen to be 10 volts. Other signal characteristics, such as pulse width or period, may also be varied in order to differentiate the test mode initiating signals from those applied to the pin(s) during normal operation of the system. In addition, the memory system can be placed into a test mode by application of a sequence of commands (such as write data A-write data B-write data C) which would not occur during the normal operation of the system.

Test mode detector 60 responds to the appropriate applied voltages and/or sequence of test mode signals by allowing access to the test mode of operation. After this step, a test mode code which is associated with an internally generated signal of interest is applied on an input/output line, such as pad 40. The test mode code is written to a test mode latch (not shown) which allows pad 40 or address pin 13 (or another data input location) to be used for other purposes during processing of the data associated with the testing process.

The test mode code is compared to a set of predetermined codes by decoding logic contained in test mode detector/decoder 60, in order to verify the validity of the entered test mode code. If the entered code corresponds to a valid test mode, a test mode enabling signal is sent to both digital test signal switch 62 and analog test signal switch 64. This sequence of steps places the system into a desired test mode and causes a desired one of the digital internal signals 66 to be routed out of digital test signal switch 62 to data read line 42. If an analog signal is to be accessed, the signal is routed by analog test signal switch 64 to address pin 13. Further details of the method by which the memory system is placed into a test mode and how a test mode signal is decoded and verified can be found in the previously mentioned U.S. Pat. No. 5,526,364, entitled, "Apparatus for Entering and Executing test Mode Operations for Memory".

In order to prevent incorrect data from being provided to pad 40 or address pin 13 when a test mode enable signal is provided by test mode detector/decoder 60, sense amplifier 52 is disabled by means of sense amplifier enable line 54, and status register 26 is disabled by means of status read enable line 27. This disabling can be achieved by bringing enable lines 54 and 27 to a low level, thereby bringing the output of sense amplifier 52 and status register 26 to a high impedance. This ensures that in the case of a digital signal, only the desired internal signal 66 will be routed to pad 40 along data read path 42.

Examples of the internal signals 66 which are provided to digital test signal switch 62 or analog test signal switch 64 and can be routed to pad 40 or address pin 13 include signals indicative of the major stages in the erase operation of the memory system: pre-program, erase high voltage, verify signal, verify ok signal, increment address signal, increment pulse signal, maximum address detected signal, and maximum pulse allowed signal. Another type of internal signal which can be accessed is one which enables reading or verifying the contents of an internal storage register. Still another type of internal signal which can be accessed are those which can be used to perform a current/voltage characterization on a selected memory cell. Other signals indicative of the operation or status of the memory system may also be supplied as internal signals 66 by routing them so that they are available to digital or analog test signal switches 62 and 64.

Figure 4:
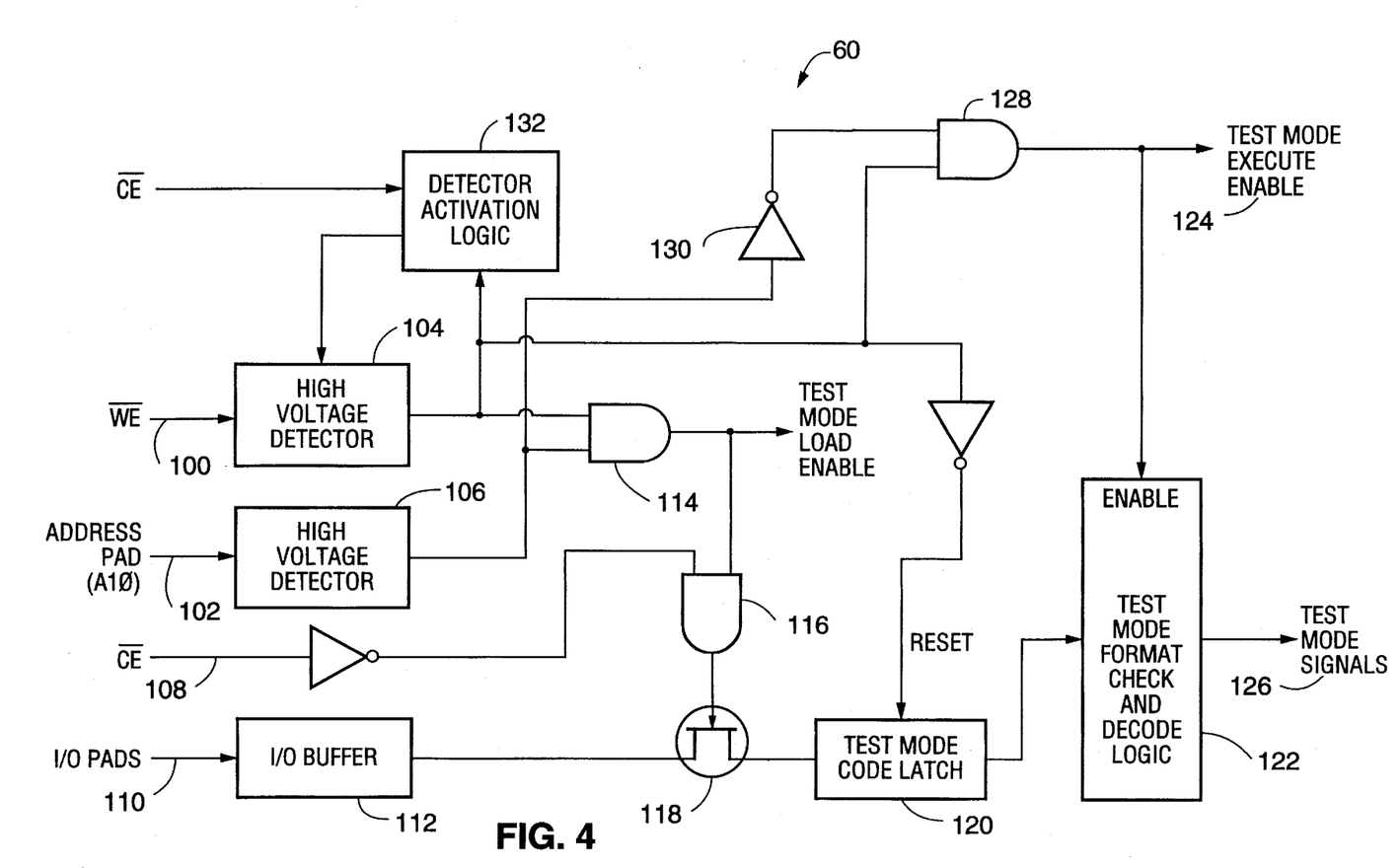
FIG. 4 is a schematic of a circuit for the test mode detector/decoder circuit of FIG. 3, which is used to place the present invention into a test mode and to decode which internal signal is to be accessed.

FIG. 4 is a schematic of a circuit for the test mode detector/decoder circuit 60 of FIG. 3, which can be used to place the present invention into a test mode and to decode which internal signal is to be accessed. In order to switch the memory system to a test mode of operation, test mode commands must be applied to the data I/O terminals of the memory to indicate which one of various test modes is to be entered, i.e., which of the internal signals is to be accessed.

Typically, the end user of the memory system would have no reason to cause the memory system to enter the test mode since this mode is intended to be used by the memory fabrication facility. Furthermore, accidental entry into the test mode is to be avoided since the memory could be rendered permanently inoperable in this mode. Thus, the test mode circuitry is designed to reduce the likelihood of accidental entry into the test mode by requiring simultaneous application of high voltages to multiple memory system terminals.

In one embodiment, the circuit of FIG. 4 is activated by application of a high voltage to two or more terminals 100 and 102 of the memory system from an external source. These terminals are typically non-dedicated terminals used during normal memory operations. Terminals 100 and 102 may include, for example, address terminal (pad) A10 and the write enable terminal $\overline{WE}$. The magnitude of the high voltage applied to terminals 100 and 102 is chosen to be outside of the range of voltages which would typically be applied to those terminals during use of the terminals in normal (non-test mode) operation of the memory system. This is done to prevent an end user from unintentionally entering the test mode. The high voltage applied to terminals 100 and 102 is detected by detectors 104 and 106. A detector circuit suited for use in constructing detectors 104 and 106 is described in U.S. patent application Ser. No. 08/493,162, entitled, "Integrated Circuit Having High Voltage Detection Circuit", filed Jun. 21, 1995, the disclosure of which is hereby incorporated in full by reference. As noted, the memory system can also be placed into a test mode by application of a sequence of commands which would not occur during the normal operation of the system.

After application of the high voltage to terminals 100 and 102, a signal on another terminal 108, in this case the chip enable $\overline{CE}$ terminal, is made active (low). Test code data corresponding to one of several possible test modes is placed on the data I/O terminals 110 of the memory and forwarded to an I/O buffer 112.

An AND gate 114 provides a test mode load enable signal when the outputs of both high voltage detectors 104 and 106 indicate that a sufficiently high voltage (i.e., outside the range of voltages applied during normal operation) is being applied to the two terminals 100 and 102. The load enable signal is coupled to one input of an AND gate 116 together with an inverted signal $\overline{CE}$. This causes AND gate 116 to turn on pass transistor 118 which will forward the test code data to buffer 112 and then to a test mode code latch 120. Separate I/O terminals and pass transistors 118 are used for each bit of input test mode data so that the data will be loaded into latch 120 in parallel. Typically there are a total of eight bits of test code data so that latch 120 will contain eight bits. Signal $\overline{CE}$ is then brought back to a high state, thereby latching the test code data in latch 120.

After latch 120 has been loaded with the test code data, one of the high input voltages, such as the input to address A10 terminal 102 is removed so that the output of detector 106 will go low thereby providing a high input to an AND gate 128 by way of inverter 130. Since the remaining input of gate 128, the output of the second high voltage detector 104, will still be high, gate 128 will produce a test mode enable signal 124. Among other things, this will enable Test Mode and Format Check and Decode Logic unit 122 which will verify that the data in latch 120 corresponds to one of the proper test modes. In addition, unit 122 will decode the test mode code to determine which one of the different memory test modes has been entered, thereby determining which set of internal signals will be accessible. The test modes each have an associated test mode signal 126 which is produced by Test Mode and Format Check and Decode Logic unit 122 and which is used by the memory system in combination with other signals for carrying out the various test mode functions, such as controlling the routing of the internal signals which will be accessed.

The system will remain in the selected test mode as long as the voltage applied to terminal 100 remains high. When signal $\overline{CE}$ is brought back to a high state, detector activation logic 132 keeps detector circuits 104 and 106 enabled as long as the voltage applied to terminal 100 remains high. During the course of carrying out the various test modes operations, it may be necessary to periodically change the state of the chip enable $\overline{CE}$ signal. However, since address A10 on line 102 has been shifted to a low state, the low output of AND gate 116 will prevent any change in the contents of the test mode code latch. Once the test mode operation is completed, the high voltage applied to terminal 100 is removed thereby causing the output of AND gate 128 to go low and ending the test mode operation.

The test mode codes loaded into latch 120 are preferably of a specific format thereby further reducing the possibility of accidental entry into a test mode. The test mode code is typically divided into two groups of bits, with the first group of bits, the format bits, signifying a test mode operation and the remaining bits signifying a particular one of the test modes. A further description of the test code formats can be found in the previously mentioned U.S. Patent entitled, "Apparatus for Entering and Executing test Mode Operations for Memory".

Test mode enable signal 124 enables digital test signal switch (multiplexer) 62 and analog test signal switch (multiplexer) 64. Valid test mode code signal 126 then specifies which internal signal(s) 66 are routed by test signal switches 62 and 64 to read data path 42 (in the case of a digital signal) or to an address pin 13 (in the case of an analog signal).

The present invention enables a memory chip designer to access signals generated during the operation of the memory system. These signals are not available to a normal user of the memory system who is carrying out programming, erasing, and read operations on the cells of the memory system. Access to the test signals is achieved by placing the memory system into a test mode and entering a code corresponding to the particular signal(s) which are desired. A digital or analog multiplexer is then used to route the specified signal to an I/O pad or address pin where it can be accessed. As the procedure for placing the memory system into a test mode involves applying voltages which are outside of the normal operating range, the test mode cannot be accidentally accessed by a standard user of the memory system.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

I claim:

1. A memory system having a standard mode of operation in which a user can program, erase, and read a memory cell and a test mode of operation in which internal signals used to monitor the memory system can be accessed, wherein access to the test mode of operation occurs upon detection of a test mode access state different from states which occur during the standard mode of operation, the memory system comprising:

test mode detection means for detecting the test mode access state for accessing the test mode of operation, wherein the test mode access state is different from states which occur during the standard mode of operation;

switching means for selecting which of a plurality of internal signals input to the switching means for use in monitoring an operating status of the memory system is to be routed to a data output means when the test mode of operation is accessed; and data output means to which the selected signal is routed by the switching means.

2. The memory system of claim 1, wherein the internal signals for use in monitoring the memory system include digital and analog signals.

3. The memory system of claim 1, wherein the test mode access state which permits access to the test mode is detection of a test mode access signal which is different than signals applied during the standard mode of operation.

4. The memory system of claim 3, wherein a plurality of test mode access signals are used to access the test mode of operation.

5. The memory system of claim 1, wherein the data output means to which the selected signal is routed is a data input/output pad of the memory system.

6. The memory system of claim 1, wherein the data output means to which the selected signal is routed is an address pin of the memory system.

7. The memory system of claim 1, wherein the switching means further comprises:
   a digital test signal switch for selecting which of a plurality of digital signals is to be accessed in the test mode of operation.

8. The memory system of claim 1, wherein the switching means further comprises:
   an analog test signal switch for selecting which of a plurality of analog signals is to be accessed in the test mode of operation.

9. The memory system of claim 3, wherein the test mode detection means detects whether the test mode access signal has a voltage outside a range of voltages applied during operation in the standard mode of the memory system in order to permit access to the test mode of operation.

10. The memory system of claim 1, further comprising:
    control means for controlling the switching means to select which of the plurality of internal signals is routed by the switching means in the test mode of operation, wherein the control means responds to a signal indicative of which of the plurality of internal signals is to be routed by routing that signal to the data output means.

11. The memory system of claim 1, wherein the test mode access state which permits access to the test mode is detection of a sequence of command signals which would not be applied during the standard mode of operation.

12. A method of accessing internal signals generated by a memory system, the memory system having a standard mode of operation in which a user can program, erase, and read a memory cell and a test mode of operation in which internal signals used to monitor the memory system can be accessed, where access to the test mode of operation occurs upon detection of a test mode access state different from states which occur during the standard mode of operation, the method comprising:
    applying a test mode access signal to produce the test mode access state for entering the test mode of operation, wherein the test mode access state is different from states produced during the standard mode of operation;
    verifying that the test mode access state produced is a valid one allowing entry to the test mode of operation;
    selecting which of a plurality of internal signals for use in monitoring the memory system is to be routed to a data output means when the test mode of operation is accessed; and
    routing the selected signal to the data output means when the test mode of operation is accessed.

13. The method of accessing internal signals generated by a memory system of claim 12, wherein the internal signals for use in monitoring the memory system include digital and analog signals.

14. The method of accessing internal signals generated by a memory system of claim 12, wherein the test mode access state which permits access to the test mode is detection of a test mode access signal which is different than signals applied during the standard mode of operation.

15. The method of accessing internal signals generated by a memory system of claim 12, wherein a plurality of test mode access signals are used to produce the test mode access state.

16. The method of accessing internal signals generated by a memory system of claim 12, wherein the selected signal is routed to a data input/output pad of the memory system.

17. The method of accessing internal signals generated by a memory system of claim 12, wherein the selected signal is routed to an address pin of the memory system.

18. The method of accessing internal signals generated by a memory system of claim 14, wherein the step of verifying that the test mode access state produced is a valid one further comprises:
    determining if the test mode access signal applied to enter the test mode is a voltage outside a range of voltages applied during operation in the standard mode of the memory system.

19. The method of accessing internal signals generated by a memory system of claim 12, wherein the test mode access signal which produces the test mode access state is a sequence of command signals different from those which would be applied during the standard mode of operation.

20. A data processing system having a standard mode of operation in which a user can perform data processing functions and a test mode of operation in which internal signals used to monitor the data processing system can be accessed, where access to the test mode of operation is based on detection of a test mode access state which is different from states which occur during the standard mode of operation, the data processing system comprising:
    test mode access state detection means for detecting a test mode access signal used to produce the test mode access state;
    switching means for selecting which of a plurality of internal signals input to the switching means for use in monitoring the data processing system is to be routed to a data output means when the test mode of operation is accessed; and
    data output means to which the selected signal is routed by the switching means.

21. The data processing system of claim 20, wherein the data processing system includes a memory system which generates the internal signals routed by the switching means.

22. The data processing system of claim 20, wherein the internal signals for use in monitoring the data processing system include digital and analog signals.

23. The data processing system of claim 20, wherein a plurality of test mode access signals are used to produce the test mode access state.

24. The data processing system of claim 20, wherein the switching means further comprises:
    a digital test signal switch for selecting which of a plurality of digital signals is to be accessed in the test mode of operation.

25. The data processing system of claim 20, wherein the switching means further comprises:

an analog test signal switch for selecting which of a plurality of analog signals is to be accessed in the test mode of operation.

26. The data processing system of claim 20, wherein the test mode access state detection means detects whether the test mode access signal has a voltage outside a range of voltages applied during operation in the standard mode of the data processing system.

27. The data processing system of claim 20, wherein the test mode access state detection means detects a sequence of command signals which would not be applied during the standard mode of operation in order to produce the test mode access state.

28. A memory system having a standard mode of operation in which a user can program, erase, and read a memory cell and a test mode of operation in which internal signals indicative of a status of the memory system and generated by the system during the standard mode of operation can be accessed, wherein access to the test mode of operation occurs upon detection of a test mode access state different from states which occur during the standard mode of operation, the memory system comprising:
- a controller for generating a plurality of internal signals indicative of the status of the memory system, wherein the internal signals are generated by the controller during the standard mode of operation;
- a test mode detector for detecting the test mode access state for accessing the test mode of operation, wherein the test mode access state is different from states which occur during the standard mode of operation;
- a signal selector switch for selecting which of the plurality of internal signals indicative of the status of the memory system which is input to the signal selector switch is to be routed to a data output node when the test mode of operation is accessed; and
- a data output node to which the selected signal is routed by the signal selector switch.

29. The memory system of claim 28, wherein the internal signals indicative of a status of the memory system include digital and analog signals.

30. The memory system of claim 28, wherein the test mode access state which permits access to the test mode is detection of a test mode access signal which is outside of a range of signals applied during the standard mode of operation.

31. The memory system of claim 30, wherein a plurality of test mode access signals are used to access the test mode of operation.

32. The memory system of claim 28, wherein the data output node to which the selected signal is routed is a data input/output pad of the memory system.

33. The memory system of claim 28, wherein the data output node to which the selected signal is routed is an address pin of the memory system.

34. The memory system of claim 28, wherein the signal selector switch further comprises:
- a digital test signal switch for selecting which of a plurality of digital signals is to be accessed in the test mode of operation.

35. The memory system of claim 28, wherein the signal selector switch further comprises:
- an analog test signal switch for selecting which of a plurality of analog signals is to be accessed in the test mode of operation.

36. The memory system of claim 30, wherein the test mode detector detects whether the test mode access signal has a voltage outside a range of voltages applied during operation in the standard mode of the memory system in order to permit access to the test mode of operation.

37. The memory system of claim 28, further comprising:
- a second controller for controlling the signal selector switch to select which of the plurality of signals is routed by the switch in the test mode of operation, wherein the second controller responds to a signal indicative of which of the plurality of signals is to be routed by routing that signal to the data output node.

38. The memory system of claim 28, wherein the test mode access state which permits access to the test mode is detection of a sequence of command signals which would not be applied during the standard mode of operation.

* * * * *